(12) United States Patent
Sogo

(10) Patent No.: US 7,072,429 B1
(45) Date of Patent: Jul. 4, 2006

(54) FILTER COEFFICIENT SETTING TECHNIQUE FOR VARIABLE FILTERING PROCESS AND VARIABLE SAMPLING FREQUENCY CONVERSION

(75) Inventor: Akira Sogo, Hamamatsu (JP)

(73) Assignee: Yamaha Corporation, Hamamatsu (JP)

( * ) Notice: Subject to any disclaimer, the term of this patent is extended or adjusted under 35 U.S.C. 154(b) by 0 days.

(21) Appl. No.: 08/911,315

(22) Filed: Aug. 19, 1997

(30) Foreign Application Priority Data

Aug. 21, 1996 (JP) .................................. 8-220051

(51) Int. Cl.
*H04B 1/10* (2006.01)
(52) U.S. Cl. ..................... 375/350; 708/315; 708/420
(58) Field of Classification Search ................ 375/350; 708/315, 420
See application file for complete search history.

(56) References Cited

U.S. PATENT DOCUMENTS

| | | | | |
|---|---|---|---|---|
| 5,250,748 A | * | 10/1993 | Suzuki | ........................ 84/661 |
| 5,365,468 A | * | 11/1994 | Kakubo et al. | .......... 364/724.1 |
| 5,451,944 A | * | 9/1995 | Sogo | ............................ 341/61 |

\* cited by examiner

Primary Examiner—William Luther
Assistant Examiner—Chi H. Pham
(74) Attorney, Agent, or Firm—Morrison & Foerster

(57) ABSTRACT

A first series of filter coefficients stored in a memory itself corresponds to a given filter characteristic such as a given high cutoff frequency. A second series of filter coefficients is generated by performing an interpolation process on the first series of filter coefficients. At that time, the contents, such as interpolation coefficients, of the interpolation process are varied in correspondence to a desired filter characteristic to be achieved, so that the interpolation process generates a second series of filter coefficients according to an impulse response characteristic that is obtained as a consequence of expanding or compressing, in a time-axis direction, an impulse response characteristic represented by the given first series of the filter coefficients. Thus, by the interpolation process, there is produced such a second series of filter coefficients that achieves a different filter characteristic (e.g., different high cutoff frequency). Where the sampling frequency of a time series of digital signals is to be changed from a given first frequency to a second frequency, an aliasing noise frequency may vary depending on a value of the first or second sampling frequency, in which case it is necessary to vary the cutoff frequency of a filter for eliminating the aliasing noise. However, by performing the interpolation process in the above-noted manner, the filter characteristic for eliminating the aliasing noise can be varied as desired.

5 Claims, 5 Drawing Sheets

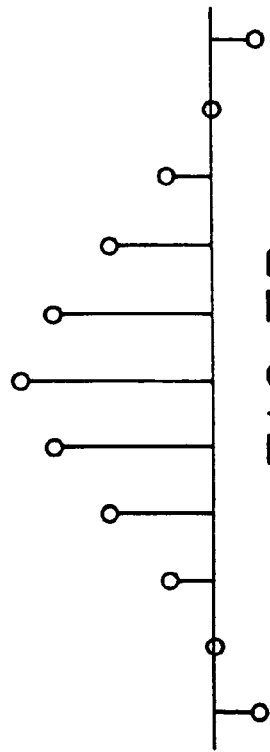
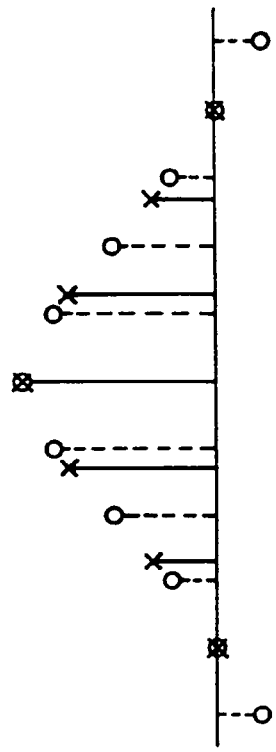
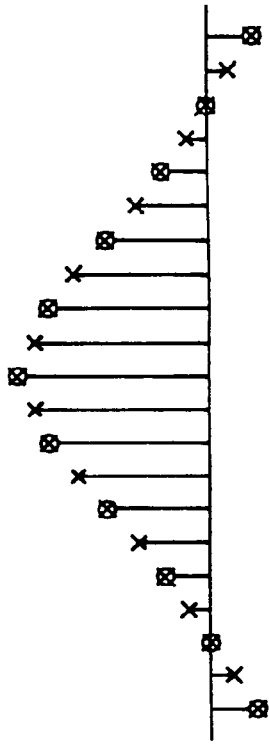
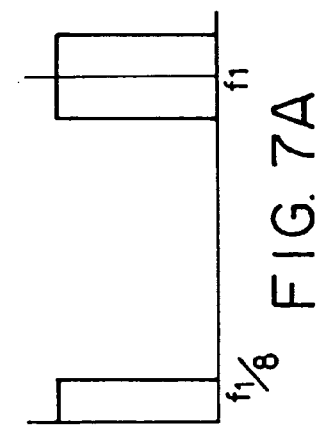
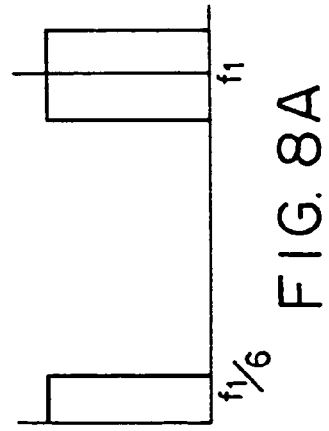
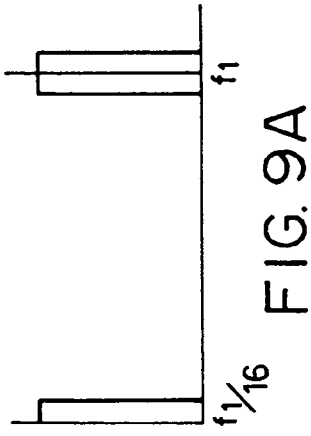

FILTER COEFFICIENT SETTING TECHNIQUE FOR VARIABLE FILTERING PROCESS AND VARIABLE SAMPLING FREQUENCY CONVERSION

BACKGROUND OF THE INVENTION

The present invention relates to a method and device for setting filter coefficients, and a sampling frequency converting method and devices using these filter coefficient setting method and device.

In general, digital signal processing systems for use in digital audio apparatuses are constructed to process digital signals of a predetermined sampling frequency. However, with recent development of multimedia technology, it sometimes becomes necessary to allow the digital signal processing systems to process digital signals of a different sampling frequency from the predetermined sampling frequency. To this end, a sampling frequency convertor device has so far been employed which converts the sampling frequency of the digital signals to properly fit the nature of processing to be performed by the digital signal processing system.

In FIG. 10, there is shown an exemplary setup of such a conventional sampling frequency convertor device. As shown, this convertor device comprises a filter 1, an interpolation filter 2, a coefficient memory 3 and a selector section 4. The interpolation filter 2 is provided to interpolate between input digital signals, passed through the filter 1, on the time axis, so as to convert them into digital signals of an intended sampling frequency. The interpolation by the interpolation filter 2 may be a linear interpolation between every two samples, polynomial interpolation using several samples at a time (e.g., using Lagrangian function), spline interpolation or the like.

The filter 1 preceding the interpolation filter 2 operates to previously eliminate, from the input digital signals, high-frequency spectral components that would cause unwanted aliasing noise. For example, in a case where the intended sampling frequency after the conversion (after-conversion sampling frequency) is "$f_2$", if the input digital signal waveform passed to the interpolation filter 2 contains spectral components higher than $f_2/2$, these spectral components would cause aliasing noise. Thus, to prevent such unwanted aliasing noise from being produced from the interpolation filter 2, the filter 1 is provided to eliminate the spectral components higher than the $f_2/2$ frequency.

In the conventional sampling frequency converter device, the high-frequency-components eliminating process by the filter 1 is carried out by convoluting a time series of filter coefficients into a time-series of input digital signals, and the cutoff frequency used for the high-frequency-components eliminating process is determined from the sampling frequency of the input digital signals and the filter coefficient time series used for the convolution. Namely, given filter coefficients that provide a cutoff frequency "fc" when convoluted into input digital signals of sampling frequency "fa", then the high cutoff frequency when the filter coefficients are convoluted into input digital signals of sampling frequency "fb" will be "fc·(fb/fa)".

Thus, if input digital signals of various sampling frequencies $f_1$ are supplied, it is necessary to switch from one filter coefficient time series to another depending on the individual sampling frequencies $f_1$, even where the after-conversion sampling frequency $f_2$ is fixed at a given frequency. Similarly, when input digital signals of a single sampling frequency $f_1$ are to be converted to assume a plurality of sampling frequencies $f_2$, it is necessary to switch from one filter coefficient time series to another depending on the individual intended sampling frequencies $f_2$.

Therefore, in the sampling frequency convertor device shown in FIG. 10, the coefficient memory 3 has prestored therein various time series of filter coefficients corresponding to various possible ratios between the after-conversion sampling frequency $f_2$ and the before-conversion sampling frequency $f_1$ of the input digital signals; each of such ratios will hereinafter be referred to as a conversion ratio k ($k=f_2/f_1$). In the sampling frequency conversion, one of the time series of filter coefficients corresponding to the conversion ratio k is selected to be read out from the coefficient memory 3 by means of the selector section 4 and then set in the filter 1 for use thereby.

Thus, the conventionally-known sampling frequency convertor device is able to perform sampling frequency conversion at various conversion ratios, which, however, requires not only determination of the various time series of filter coefficients corresponding to the various possible conversion ratios but also storage of the determined time series in the coefficient memory 3. Consequently, if the number of the conversion ratios is great, the coefficient memory 3 must be of a great capacity to store many time series of filter coefficients corresponding to the conversion ratios.

In the event that such a great-capacity coefficient memory 3 can not be used, fewer time series of filter coefficients corresponding to some representative conversion ratios are prestored in the coefficient memory 3 so that one of the time series closest to a desired conversion ratio is selected to be used in the sampling frequency conversion. However, this approach would encounter the following problems due to disagreement between a half (½) of the after-conversion sampling frequency $f_2$ and the high cutoff frequency fc.

If the high cutoff frequency fc of the filter 1 is lower than the frequency $f_2/2$, high-frequency spectral components are eliminated from the waveform of input digital signals more than necessary, which would lead to deterioration of reproduced sound quality and the like. FIG. 11 illustratively shows such an inconvenience, in which reference character A represents a spectrum of the waveform of input digital signals supplied to the filter 1, reference character B represents a spectral range over which no aliasing noise results from the sampling frequency conversion by the interpolation filter 2, and reference character C represents a spectral range of the waveform of the digital signals passed through the filter 1. In this example, the high cutoff frequency fc of the filter 1 is set to a frequency $f_1/4$ lower than the frequency $f_2/2$, so that spectral components within a frequency range from $f_1/4$ to $f_2/2$ are eliminated although these components would not cause aliasing noise and hence need not be eliminated.

Conversely, if the high cutoff frequency fc of the filter 1 is higher than the half of the frequency $f_2/2$, input digital signals containing spectral components higher than the frequency $f_2/2$ may be passed to the interpolation filter 2, and hence aliasing noise would result from the sampling frequency conversion performed by the interpolation filter 2. FIG. 12 illustratively shows such an inconvenience. In this illustrated example, the high cutoff frequency fc of the filter 1 is set to a frequency $f_1/4$ higher than the frequency $f_2/2$, so that spectral components within a frequency range from $f_2/2$ to $f_1/4$ would be passed to the interpolation filter 2 without being eliminated by the filter 1. As a result, unwanted aliasing noise would result from the sampling frequency conversion to the sampling frequency $f_2$ performed by the interpolation filter 2.

To avoid the above-discussed inconveniences, such a filter is required which can adjust, as desired, the high cutoff frequency fc of the filter 1 in correspondence to every possible conversion ratio. However, due to a limited storage capacity of the coefficient memory 3, it has been extremely difficult to realize a filter that can appropriately meet such a requirement.

Further, it has been conventionally known, in the art of digital filters, to interpolate between prestored filter coefficients to thereby generate filter coefficients at shorter intervals than the prestored filter coefficients. However, the conventional filter interpolating techniques can not freely vary filter characteristics to be achieved, and can just prestore fewer filter coefficients than those necessary for the filter characteristics to be achieved and make up for the insufficiency by interpolating between prestored filter coefficients. Consequently, in order to achieve a plurality of different filter characteristics, it was absolutely necessary to prestore a plurality of series of filter coefficients corresponding to the number of the filter characteristics to be achieved.

SUMMARY OF THE INVENTION

It is therefore an object of the present invention to provide a filter coefficient setting method and device which allow a series of filter coefficients, corresponding to any desired high cutoff frequency, to be set in a filter without using a great-capacity coefficient memory, and a sampling frequency converting method and device using such a filter coefficient setting method and device.

In order to accomplish the above-mentioned object, the present invention is constructed to set in a filter a series of filter coefficients corresponding to any desired high cutoff frequency, on the basis of the following principle.

First, to facilitate understanding of the present invention, the principle of filtering in digital signal processing will be explained, although it is well known in the art.

FIG. 1A shows a time function a(t) on the time axis t, and FIG. 1B shows an amplitude characteristic $|A(\omega)|$ of Fourier transformation $A(\omega)$ of the time function a(t). FIG. 1C shows another time function b(t) on the time axis t, and FIG. 1D shows an amplitude characteristic $|B(\omega)|$ of Fourier transformation $B(\omega)$ of the time function b(t).

Given a function c(t) obtained by convoluting the time function b(t) into the time function a(t) (i.e., c(t)=a(t)*b(t)) (see FIG. 1E), the Fourier transformation of this function c(t) is equal to the product between the respective Fourier transformations of the original time functions a(t) and b(t) (i.e., $c(\omega)=A(\omega)\cdot B(\omega)$). FIG. 1E shows the function c(t) (=a(t)*b(t)) obtained by convoluting the time function b(t) into the time function a(t), and FIG. 1F shows an amplitude characteristic $|C(\omega)|$ of the product, $c(\omega)=A(\omega)\cdot B(\omega)$, between the respective Fourier transformations of the time functions.

The foregoing are mathematical expressions established in Fourier transformation, and the following conclusion is obtained by applying these mathematical expressions to the signal processing. Namely, in order to impart a predetermined filter characteristic $B(\omega)$ to a spectrum $A(\omega)$ of input signal a(t), it is only necessary that the time function b(t) obtained by inverse Fourier transformation of the filter characteristic $B(\omega)$ be convoluted into the input signal a(t).

In digital signal processing, filtering is generally performed by convoluting a time series of filter coefficients into a time series of digital signals, and it can be said that such filtering is essentially based on the foregoing principle.

The primary object of the present invention is to optionally adjust a filter characteristic (particularly, a high cutoff frequency in applications such as the above-discussed conventional technique) in the filtering process of digital signals.

In order to optionally adjust a filter characteristic, it is necessary generate series of filter coefficients which permit execution of such a filtering process, and all of the conventional techniques newly calculate such series of filter coefficients, for example, each time the high cutoff frequency varies. However, once a particular series of filter coefficients corresponding to a given filter characteristic is obtained, the present invention can generate another series of filter coefficients corresponding to any desired filter characteristic by just applying a simple process or modification to the originally obtained filter coefficients, rather than by newly calculating the entire series of filter coefficients, as will be described in detail in the following paragraphs.

First, consider a time function b(pt) obtained by compressing the time function b(t) of FIG. 1C by a factor of "p" in the time-axis direction. The Fourier transformation of this time function b(pt) will be $(1/p)B(\omega/p)$, which is a consequence of expanding the Fourier transformation $B(\omega)$ of the time function b(t) by a factor of "p" and also compressing its amplitude by a factor of "p" (see $|(1/p)B(\omega/p)|$ in FIG. 1D).

The following conclusion may be reached by applying the foregoing to digital signal processing. Consider a case where a series of filter coefficients has already been obtained to permit elimination of high-frequency components above a given high cutoff frequency fc. If, in this case, a waveform obtained by compressing the waveform represented by that series of filter coefficients by a factor of "p" in the time-axis direction is sampled in synchronism with input digital signals to thereby generate another or new series of filter coefficients and this new series of filter coefficients is convoluted into the input digital signals, a high-frequency-components eliminating process based on a high cutoff frequency p·fc can be performed on the input digital signals. Note that compressing the series of filter coefficients, to be convoluted into the input digital signals, by a factor of "p" in the time-axis direction will lower the level of digital signals resulting from the filter process by a factor of "p". To avoid such a variation in the signal level, a compensation is needed to multiply the factor "p" after the convolution of the filter coefficients into the input digital signals.

Based on the above-mentioned principle, the present invention provides a technique of generating a series of filter coefficients corresponding to a desired filter characteristic and setting the thus-generated filter coefficients in a filter.

More specifically, the present invention provides a method of setting filter coefficients for a filter that performs filtering process on a time series of digital signals by convoluting filter coefficients into the digital signals, and this method comprises the steps of: performing an interpolation process on a given first series of the filter coefficients, wherein contents of the interpolation process are varied in correspondence to a desired filter characteristic to be achieved, in such a manner that the interpolation process generates a second series of the filter coefficients according to an impulse response characteristic that is obtained as a consequence of expanding or compressing, in a time-axis direction, an impulse response characteristic represented by the given first series of the filter coefficients; and supplying the filter with the second series of the filter coefficients generated by the step of performing an interpolation process so that the filter is set to the desired filter characteristic.

The present invention also provides a filter coefficient setting device for a filter performing a filtering process on a time series of digital signals by convoluting filter coefficients into the digital signals, and the filter coefficient setting device comprises: a coefficient memory which stores therein a given first series of the filter coefficients; and a filter coefficient interpolator which performs an interpolation process on the given first series of the filter coefficients, wherein the contents of the interpolation process are varied in correspondence to a desired filter characteristic to be achieved, in such a manner that the interpolation process generates a second series of the filter coefficients according to an impulse response characteristic that is obtained as a consequence of expanding or compressing, in a time-axis direction, an impulse response characteristic represented by the first series of the filter coefficients. The second series of the filter coefficients generated by the filter coefficient interpolator is supplied to the filter so that the filter is set to the desired filter characteristic.

According to the above-mentioned arrangement, because the contents of the interpolation process are varied in correspondence to a desired filter characteristic to be achieved, the desired filter characteristic can be varied optionally while only requiring a given first series of the filter coefficients to be prestored in a coefficient memory.

The present invention also provides a method of converting a sampling frequency of a time series of digital signals inputted at a first sampling frequency into a second sampling frequency, and the method comprises the steps of: performing an interpolation process on a given first series of filter coefficients, wherein the contents of the interpolation process are varied in correspondence to a ratio between the first and second sampling frequencies in such a manner that the interpolation process generates a second series of filter coefficients according to an impulse response characteristic that is obtained as a consequence of expanding or compressing, in a time-axis direction, an impulse response characteristic represented by the given first series of filter coefficients; performing a filtering process on the digital signals inputted at the first sampling frequency by convoluting the second series of filter coefficients into the digital signals; and converting the sampling frequency of the digital signals, having undergone the filtering process, into the second sampling frequency.

The present invention further provides a sampling frequency converter device for converting a sampling frequency of a time series of digital signals inputted at a first sampling frequency to a second sampling frequency, and the sampling frequency converter device comprises: a coefficient memory which stores therein a given first series of filter coefficients; and a filter coefficient interpolator which performs an interpolation process on the first series of filter coefficients, wherein the contents of the interpolation process are varied in correspondence to a ratio between the first and second sampling frequencies in such a manner that the interpolation process generates a second series of filter coefficients according to an impulse response characteristic that is obtained as a consequence of expanding or compressing, in a time-axis direction, an impulse response characteristic represented by the first series of filter coefficients; a filter which performs a filtering process on the digital signals inputted at the first sampling frequency by convoluting the second series of filter coefficients into the digital signals; and a sampling frequency converting circuit which converts the sampling frequency of the digital signals, having undergone the filtering process, into the second sampling frequency.

According to the above-mentioned arrangement, because the contents of the interpolation process are varied in correspondence to a ratio between the first and second sampling frequencies, the desired filter characteristic can be controlled in accordance with the ratio while only requiring a given first series of the filter coefficients to be prestored in a coefficient memory; besides, the filter characteristic control can always properly deal with a variation in the first or second sampling frequency, thereby greatly enhancing the performance of the sampling frequency converter device. If, for example, the given first series of filter coefficients is used directly, there arises the inconvenience that the filter characteristic would undesirably vary as the first or second sampling frequency is changed, as noted earlier in connection with the conventional technique. However, by varying the contents of the interpolation process in correspondence to a ratio between the first and second sampling frequencies in such a manner that an impulse response characteristic of the resultant second series of filter coefficients is expanded or compressed on the time axis, the present invention can control a desired filter characteristic (e.g., cutoff frequency) to not vary even when the first or second sampling frequency is changed.

BRIEF DESCRIPTION OF THE DRAWINGS

For better understanding of the above and other features of the present invention, the preferred embodiments of the invention will be described in greater detail below with reference to the accompanying drawings, in which:

FIGS. 7 to 9 are diagrams explanatory of exemplary operation of the sampling frequency converter device according to the preferred embodiment;

DETAILED DESCRIPTION OF THE PREFERRED EMBODIMENTS

Figure 1A:
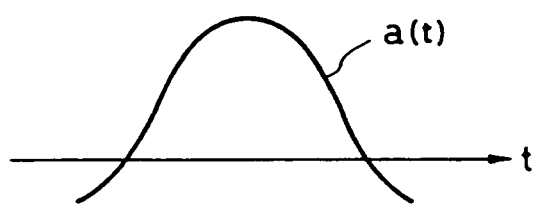
FIGS. 1A to 1F are diagrams explanatory of the basic principle of the present invention.
Figure 1B:
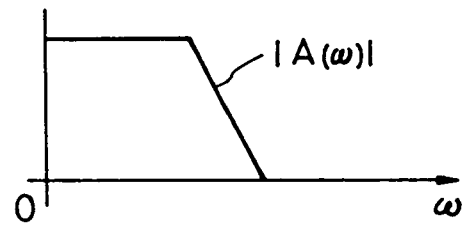
Figure 1C:
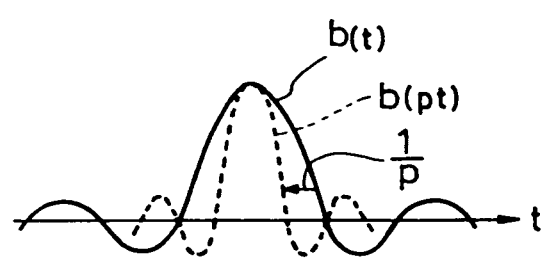
Figure 1D:
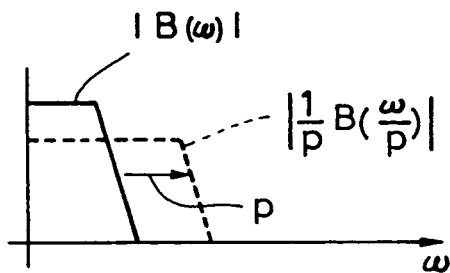
Figure 1E:
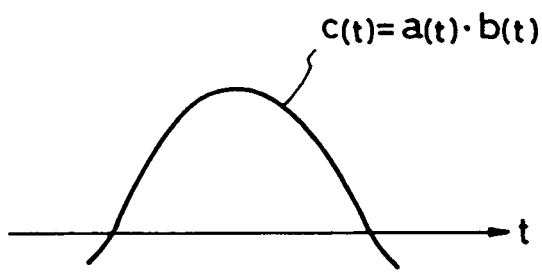
Figure 1F:
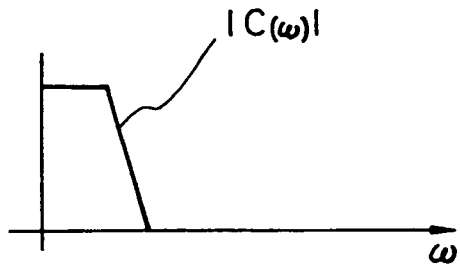
Figure 2:
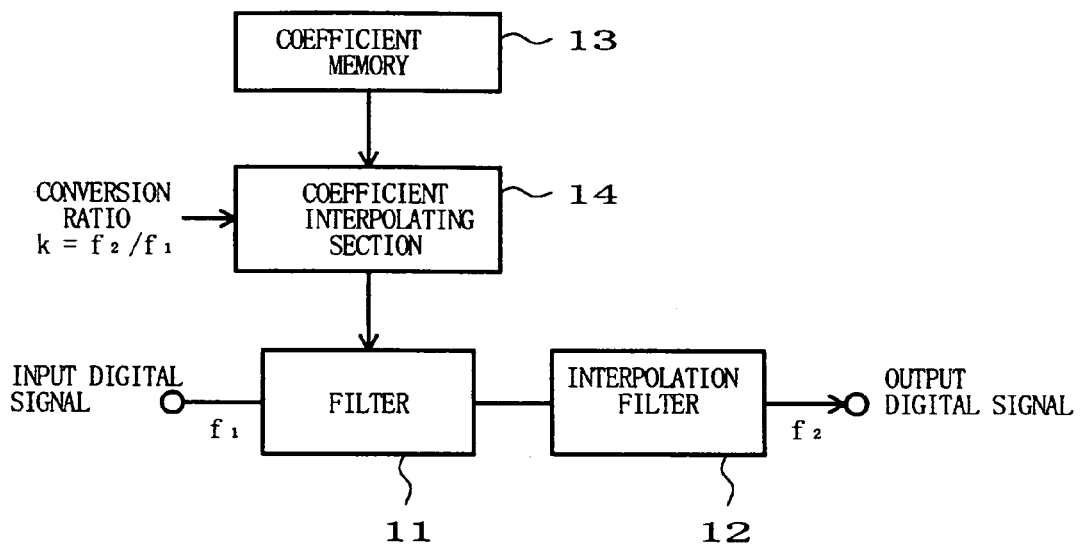
FIG. 2 is a block diagram showing an exemplary setup of a sampling frequency converter device in accordance with a preferred embodiment of the present invention.
Figure 3:
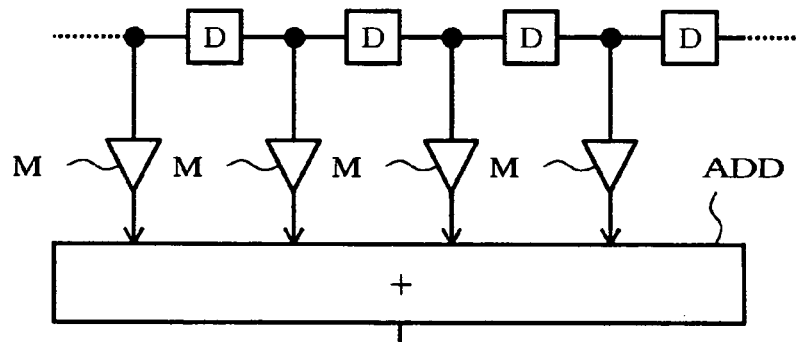
FIG. 3 is a block diagram showing an exemplary setup of a filter in the embodiment of FIG. 2.

FIG. 2 is a block diagram showing an exemplary setup of a sampling frequency converter device in accordance with a preferred embodiment of the present invention. As shown, the convertor device comprises a filter 11, an interpolation filter 12, a coefficient memory 13 and a coefficient interpolating section 14.

Figure 10:
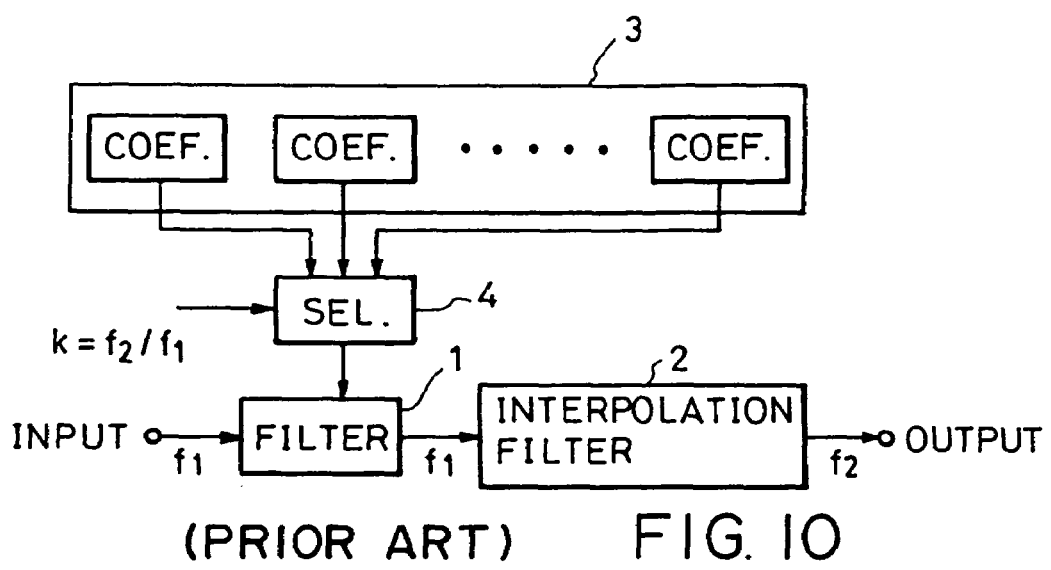
FIG. 10 is a block diagram showing an exemplary setup of a conventional sampling frequency converter device.
Figure 11:
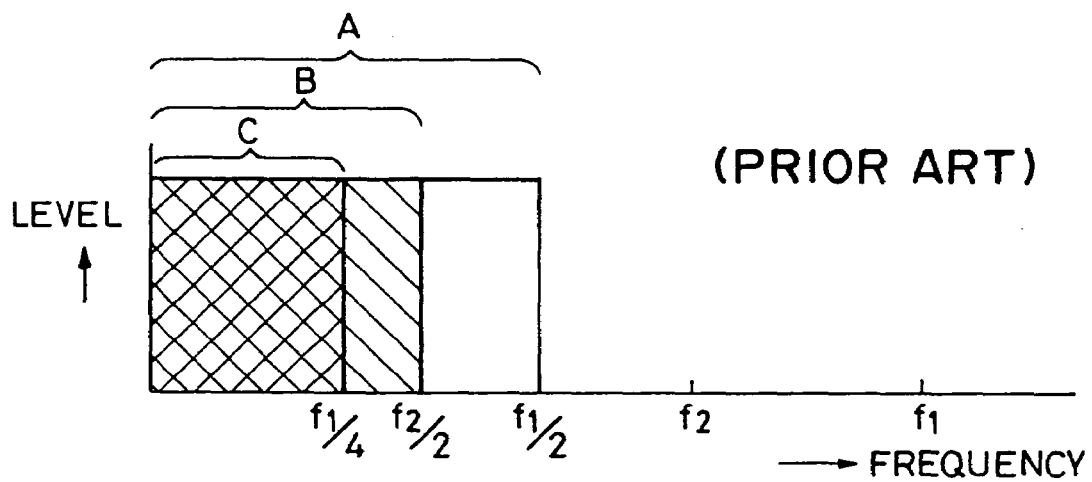
FIGS. 11 and 12 are diagrams showing problems presented by the conventional sampling frequency converter device of FIG. 10.
Figure 12:
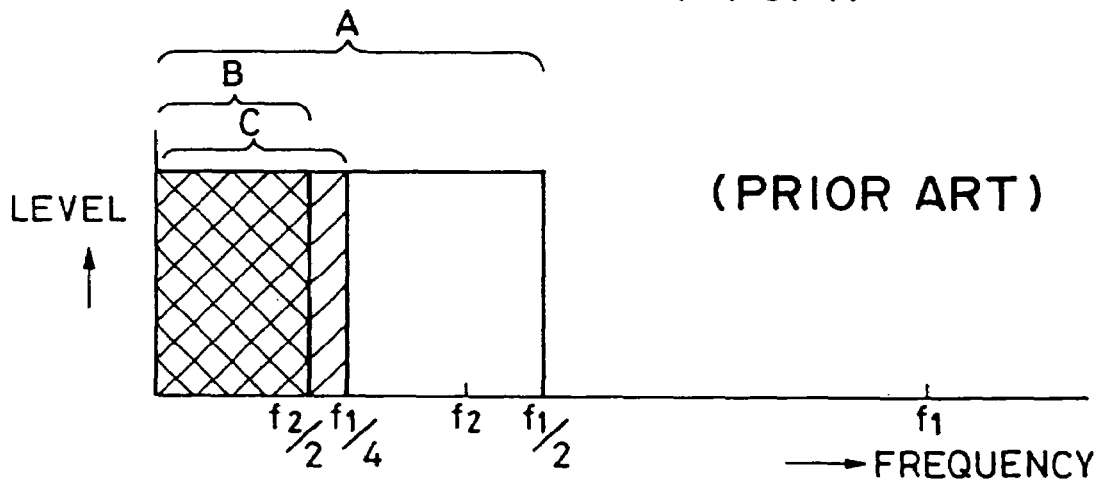

Like the filter 1 mentioned earlier in relation to FIG. 10, the filter 11 preceding the interpolation filter 12 operates to previously eliminate, from input digital signals of sampling frequency $f_1$, high-frequency components (high-frequency signals) so as to prevent unwanted aliasing noise. In the present embodiment, the filter 11 is in the form of a FIR (Finite-duration Impulse-Response) filter that comprises delay circuits D, D, . . . , multipliers M, M, . . . and an adder ADD, although the filter 11 may be constructed in any other manner. Although not specifically shown, the filter 11 includes a variable-gain amplifier at its output end. Like the interpolation filter 2 mentioned earlier in relation to FIG. 10, the interpolation filter 12 interpolates between the input digital signals, passed through the filter 11, on the time axis, so as to convert them into digital signals of an intended sampling frequency $f_2$.

Figure 4:
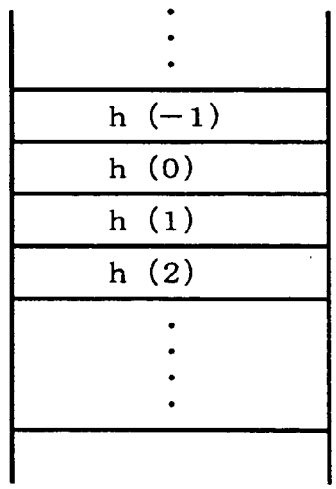
FIG. 4 is a diagram showing an example of a series of filter coefficients prestored in a coefficient memory in the embodiment of FIG. 2.

The coefficient memory 13 has prestored therein filter coefficients to be used for the high-frequency components eliminating process. Specifically, the coefficient memory 13 in the current embodiment has prestored therein only one series of filter coefficients corresponding to a single conversion ratio K (e.g., K=1/4). FIG. 4 shows how such a series of filter coefficients, h(−1), h(0), h(1), h(2) . . . , is prestored in the coefficient memory 13.

The coefficient interpolating section 14 is provided to generate another or new series of filter coefficients, corresponding to an actual conversion ratio in the interpolation filter 12, from the prestored series of filter coefficients. The following paragraphs describe in more detail exemplary operations performed by the coefficient interpolating section 14.

First, the coefficient interpolating section 14 calculates a ratio u of the actual conversion ratio k (=$f_2/f_1$) to the above-mentioned conversion ratio K (u=k/K). Then, the coefficient interpolating section 14 uses the calculated ratio u to perform interpolating calculations on the filter coefficient series, stored in the coefficient memory in correspondence to the conversion ratio K and thereby generates a series of filter coefficients corresponding to the actual conversion ratio.

Figure 5:
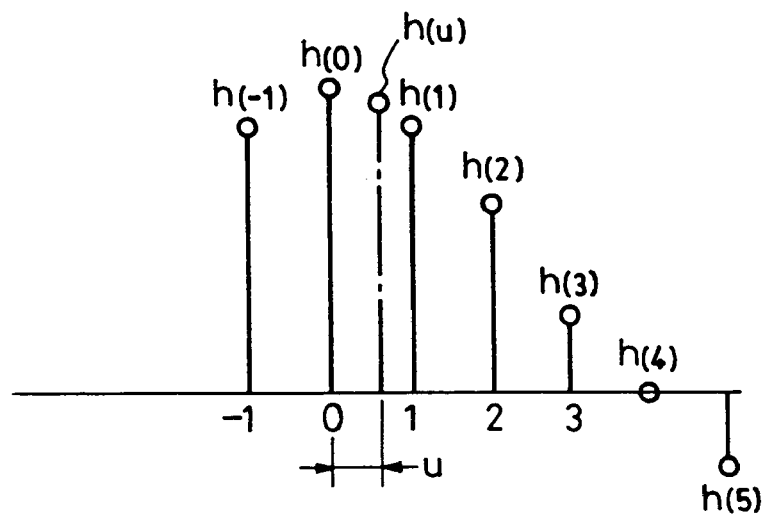
FIG. 5 is a diagram explanatory of a manner in which interpolating calculations are carried out by a coefficient interpolating section in the embodiment of FIG. 2.

FIG. 5 is a diagram explanatory of a manner in which the interpolating calculations are carried out by the coefficient interpolating section 14. Filter coefficients, h(−1), h(0), h(1), h(2), . . . , are shown in FIG. 5 as placed in a time series, and the interpolating calculations determine a series of filter coefficients, h(−u), h(0), h(u), h(2u), . . . , spaced apart from each other by an interval u.

Figure 6:
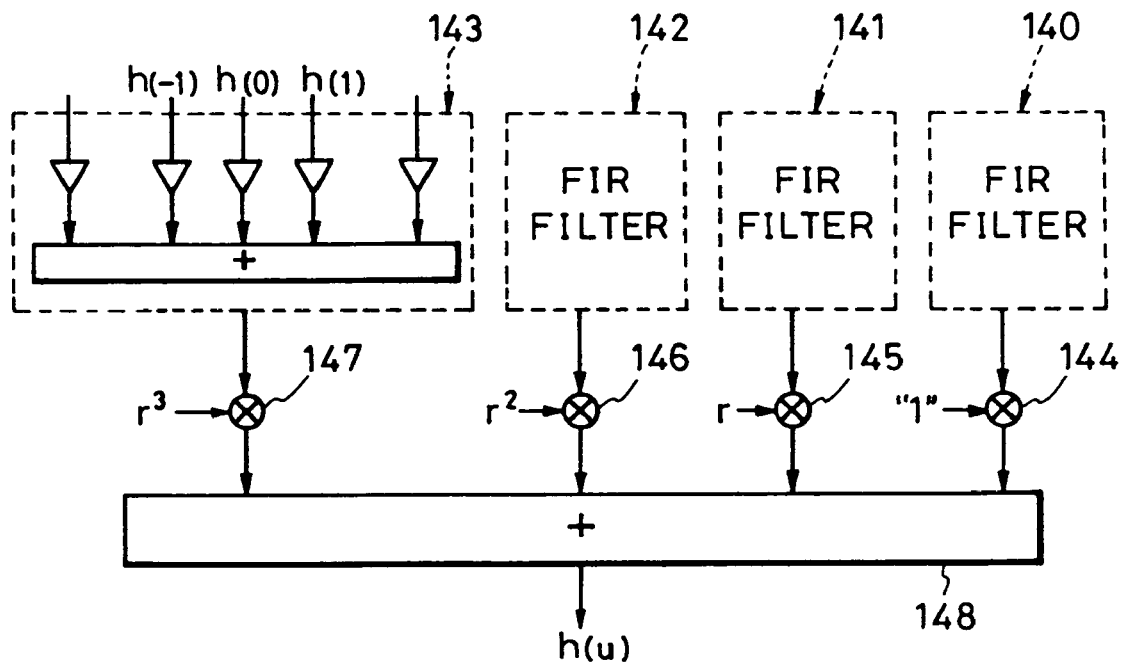
FIG. 6 illustrates an exemplary setup of the coefficient interpolating section.

Spline interpolation may be a most useful method for the interpolation between the filter coefficients in the coefficient interpolating section 14, although various other interpolation methods are also possible. FIG. 6 illustrates an exemplary setup of the coefficient interpolating section 14 that is suitable for the spline interpolation.

Namely, in each of FIR (Finite-duration Impulse-Response) filters 140 to 143, the filter coefficients, h(−1), h(0), h(1), h(2), . . . , are multiplied by predetermined coefficients and then added together. Then, multipliers 144 to 147 multiply output signals from the corresponding FIR filters 140 to 143 by numerical values "1", "r", "$r^2$", "$r^3$" obtained in correspondence to the interval u, respectively. Here, "r" represents a time-axis coordinates value of the filter coefficient to be interpolated, in a value within a range of 0≦r≦1. For instance, when filter coefficient h(0.8) between the filter coefficients h(0) and h(1) is to be calculated as the filter coefficient h(u), the value "r" is set to 0.8 (r=0.8) and values "r", "$r^2$", "$r^3$" corresponding thereto are supplied to the multipliers 145 to 147, respectively. Then, multiplication results from the multipliers 144 to 147 are added together by an adder 148 to provide the filter coefficient h(u).

When another filter coefficient between the filter coefficients h(1) and h(2) on the time axis, such as a filter coefficient h(2u)(=h(1.6)), is to be calculated, the value "r" is set to 0.6 (r=0.6) and values "r", "$r^2$", "$r^3$" corresponding thereto are supplied to the multipliers 145 to 147, respectively. Because the filter coefficient to be interpolated is between the filter coefficients h(1) and h(2) in this case, the FIR filters 140 to 143 use different coefficients from those used in the interpolating calculations of the filter coefficient h(0.8), so as to perform convoluting calculations on the filter coefficient series. The other operations are the same as those for the above-mentioned filter coefficient h(0.8). The other filter coefficients, h(3u), . . . , are calculated in a similar manner to the above-mentioned.

The interpolating method may be other than the spline interpolation, such as the Lagrangian interpolation. Alternatively, the linear interpolation may be used in a situation where required accuracy is not so high.

FIGS. 7 to 9 show exemplary operation of the sampling frequency converter device according to the present embodiment. In this example, the series of filter coefficients corresponding to the conversion ratio K (=1/4) is prestored in the coefficient memory 13. Here, if the conversion ratio K is 1/4, the sampling frequency of output digital signals will be $f_1/4$. Thus, in order to avoid aliasing noise from being produced due to undersampling, the filter 11 needs to have such a filter characteristic as to eliminate spectral components above one eighth (⅛) of the sampling frequency $f_1$ of input digital signals, as shown in FIG. 7A. To this end, a series of filter coefficients achieving the above-mentioned characteristic is determined through various calculations and then prestored in the coefficient memory 13. FIG. 7B shows that series of filter coefficients thus written in the coefficient memory 13, where each of the filter coefficients is denoted by a white circle.

Next, lets assume a case where the sampling frequency converter device carries out the sampling frequency conversion with a conversion ratio k of 1/3. In this case, the coefficient interpolating section 14 calculates a ratio u between this ratio k and the above-mentioned conversion ratio K (u=k/K=(1/3)/(1/4)=1.33, . . . ). Then, the coefficient interpolating section 14 uses the calculated ratio u to perform interpolating calculations on the filter coefficient series, and thereby generates a series of filter coefficients placed on the time axis at a pitch about 1.33 times as long as that of the original coefficient filter series. The thus-generated series of filter coefficients is set in the filter 11. FIG. 8B shows the thus-generated filter coefficients (each denoted by a crisscross mark "χ") along with the original series of filter coefficients (each denoted by a white circular mark "○").

Because the generated series of filter coefficients is obtained as a consequence of compressing the original series by a factor of about 1.33 along the time axis, the filter 11 will assume a filter characteristic that is a consequence of expanding the original filter characteristic, corresponding to the conversion ratio K of 1/4, by a factor of about 1.33 in the frequency-axis direction and compressing the original filter characteristic by a factor of about 1.33 in the amplitude-axis direction. To compensate for the compression of the filter characteristic in the amplitude-axis direction, the gain of the amplifier located at the output end of the filter 11 is set to about 1.33. FIG. 8A shows filtering characteristic of the filter 11 ultimately obtained in the above-mentioned manner. As shown, the ultimate filter characteristic of the filter 11 is a consequence of expanding the original filter characteristic, corresponding to the conversion ratio K of 1/4, by a factor of about 1.33 in the frequency-axis direction, and the high cutoff frequency fc of the filter 11 has been varied to a frequency $f_1/6$ optimum for the sampling frequency conversion at the conversion ratio of $k=1/3$.

Now, let's assume a case where the sampling frequency converter device next carries out the sampling frequency conversion with a conversion ratio k of 1/8. The coefficient interpolating section 14 calculates a ratio u between the actual conversion ratio k and the above-mentioned conversion ratio K ($u=k/K=(1/8)/(1/4)=0.5$). Then, the coefficient interpolating section 14 uses the calculated ratio u to perform interpolating calculations on the filter coefficient series, and thereby generates a series of filter coefficients placed on the time axis at a fine pitch twice as short as that of the original coefficient filter series. The thus-generated series of filter coefficients is set in the filter 11 as a filter coefficient series corresponding to the conversion ratio k of 1/8. FIG. 9B shows the thus-generated filter coefficients (each denoted by a crisscross mark "χ") along with the original series of filter coefficients (each denoted by a white circular mark "○").

Because the generated series of filter coefficients is a consequence of expanding the original series by a factor of 2 along the time axis, the filter 11 will assume a filter characteristic that is a consequence of compressing the original filter characteristic, corresponding to the conversion ratio K of 1/4, by a factor of 2 in the frequency-axis direction and expanding the original filter characteristic by a factor of 2 in the amplitude-axis direction. To compensate for the expansion of the filter characteristic in the amplitude-axis direction, the gain of the amplifier located at the output end of the filter 11 is set to 1/2. FIG. 9A shows the filter characteristic of the filter 11 ultimately obtained in the above-mentioned manner. As shown, the ultimate filter characteristic of the filter 11 is a consequence of compressing the original filter characteristic, corresponding to the conversion ratio K of 1/4, by a factor of 2 in the frequency-axis direction, and the high cutoff frequency fc of the filter 11 has been varied to a frequency $f_1/16$ optimum for the sampling frequency conversion at the conversion ratio of $k=1/8$.

Whereas the present invention has been described above as applied to a sampling frequency converter device, it may be used in a variety of other applications. For example, the filter coefficient setting method and device according to the present invention may be most suitably used in applications, other than sampling frequency conversion as mentioned above, where a need would arise to adjust the high cutoff frequency of a filter as desired. Further, whereas the present invention has been described above as adjusting the high cutoff frequency of a low-pass filter, it may be used to adjust other cutoff frequencies of any other filters than low-pass filters.

In summary, the present invention arranged in the above-mentioned manner allows a series of filter coefficients, corresponding to a desired filter characteristic, to be set in a filter without using a great-capacity coefficient memory, and permits sampling frequency conversion at any desired conversion ratio.

What is claimed is:

1. A method of setting filter coefficients for a filter performing a filtering process on a time series of digital signals by convoluting filter coefficients into said digital signals, said method comprising the steps of:
    performing an interpolation process on a given first series of the filter coefficients, wherein contents of the interpolation process are varied in correspondence to a desired filter characteristic to be achieved, in such a manner that the interpolation process generates a second series of filter coefficients according to an impulse response characteristic that is obtained as a consequence of expanding or compressing, in a time-axis direction, an impulse response characteristic represented by said given first series of the filter coefficients; and
    supplying said filter with said second series of the filter coefficients generated by the step of performing an interpolation process so that said filter is set to the desired filter characteristic.

2. A filter coefficient setting device for a filter performing a filtering process on a time series of digital signals by convoluting filter coefficients into said digital signals, said filter coefficient setting device comprising:
    a coefficient memory which stores therein a given first series of the filter coefficients; and
    a filter coefficient interpolator which performs an interpolation process on said given first series of the filter coefficients, wherein contents of the interpolation process are varied in correspondence to a desired filter characteristic to be achieved, in such a manner that the interpolation process generates a second series of filter coefficients according to an impulse response characteristic that is obtained as a consequence of expanding or compressing, in a time-axis direction, an impulse response characteristic represented by said given first series of the filter coefficients,
    wherein said second series of the filter coefficients generated by said filter coefficient interpolator is supplied to said filter so that said filter is set to the desired filter characteristic.

3. A method of converting a sampling frequency of a time series of digital signals inputted at a first sampling frequency into a second sampling frequency, said method comprising the steps of:
    performing an interpolation process on a given first series of filter coefficients, wherein contents of the interpolation process are varied in correspondence to a ratio between said first and second sampling frequencies in such a manner that the interpolation process generates a second series of filter coefficients according to an impulse response characteristic that is obtained as a consequence of expanding or compressing, in a time-axis direction, an impulse response characteristic represented by said given first series of filter coefficients;
    performing a filtering process on the digital signals inputted at said first sampling frequency by convoluting said second series of filter coefficients into said digital signals; and
    converting the sampling frequency of said digital signals, having undergone the filtering process, into said second sampling frequency.

4. A sampling frequency converter device for converting a sampling frequency of a time series of digital signals inputted at a first sampling frequency to a second sampling frequency, said sampling frequency converter device comprising:
    a coefficient memory which stores therein a given first series of filter coefficients; and
    a filter coefficient interpolator which performs an interpolation process on said given first series of filter coefficients, wherein contents of the interpolation process are varied in correspondence to a ratio between said first and second sampling frequencies in such a manner that the interpolation process generates a second series of filter coefficients according to an impulse response characteristic that is obtained as a consequence of expanding or compressing, in a time-axis direction, an impulse response characteristic represented by said given first series of filter coefficients;
a filter which performs a filtering process on the digital signals inputted at said first sampling frequency by convoluting said second series of filter coefficients into said digital signals; and
a sampling frequency converting circuit which converts the sampling frequency of said digital signals, having undergone the filtering process, into said second sampling frequency.

5. A sampling frequency converter device as recited in claim 4 wherein said sampling frequency converting circuit includes an interpolation filter which interpolates between the digital signals inputted at said first sampling frequency, passed from said filter, so as to convert said digital signals into digital signals of sampling intervals according to said second sampling frequency.

* * * * *